United States Patent [19]

Nagai

[11] Patent Number: 5,574,375
[45] Date of Patent: Nov. 12, 1996

[54] DUAL PYROELECTRIC SENSOR

[75] Inventor: Aisaku Nagai, Iwaki, Japan

[73] Assignee: Kureha Kagaku Kogyo Kabushiki Kaisha, Tokyo, Japan

[21] Appl. No.: 404,899

[22] Filed: Mar. 15, 1995

[51] Int. Cl.$^6$ .................................................. G01J 5/34
[52] U.S. Cl. ................................. 324/502; 250/338.3
[58] Field of Search .................... 324/502; 250/338.3, 250/342, 349, 338, 25.35

[56] References Cited

U.S. PATENT DOCUMENTS

| | | | |
|---|---|---|---|
| 3,839,640 | 10/1974 | Rossin | 250/353 |
| 4,983,838 | 1/1991 | Nagai et al. | 250/338.3 |

FOREIGN PATENT DOCUMENTS

| | | |
|---|---|---|
| 131996 | 1/1985 | European Pat. Off. . |
| 338711 | 10/1989 | European Pat. Off. . |
| 474495 | 3/1992 | European Pat. Off. . |
| 58-32337 | 8/1981 | Japan . |
| 61-175583 | 8/1986 | Japan . |
| 1-152226 | 10/1989 | Japan . |

*Primary Examiner*—Kenneth A. Wieder
*Assistant Examiner*—Barry C. Bowser
*Attorney, Agent, or Firm*—Wenderoth, Lind & Ponack

[57] ABSTRACT

A dual-type pyroelectric elements. The first pyroelectric element is constituted by a larger electrode on a first surface and a smaller electrode on a second surface, respectively of a pyroelectric sheet. The second pyroelectric element is on the other hand constituted by a smaller electrode on the first surface and a larger electrode on the second surface respectively of the pyroelectric sheet. Further, takeout electrodes are taken out respectively integrally from the smaller electrodes on both surfaces of the pyroelectric sheet in mutually opposite directions. As a result, even if electrodes patterns on both surfaces of the pyroelectric sheet expected to be formed in alignment with each other are actually deviated positionally, the resultant pairs of pyroelectric elements are allowed to retain substantially identical effective light-receiving areas inclusive of those given by takeout electrodes, thus providing a dual pyroelectric sensor which is excellent in performance of canceling common-mode noises caused by a vibration, temperature change or background radiation.

12 Claims, 4 Drawing Sheets

DUAL PYROELECTRIC SENSOR

FIELD OF THE INVENTION AND RELATED ART

The present invention relates to a dual-type pyroelectric sensor comprising a pair of pyroelectric (detector) elements, more particularly a dual pyroelectric sensor excellent in common-mode noise-canceling characteristic with little variation in effective light-receiving area defined as an overlapping area of a pair of patterned electrode disposed to sandwich a pyroelectric sheet even in case of relative positional deviation between the patterned electrodes formed on both major surfaces of the pyroelectric sheet.

Detection of radiation, such as infra-red radiation, is frequently used in electronic devices or appliances, such as remote switching systems, intruder alarms and movement sensors. The common principle utilized in these devices is that an action of, e.g., a human being, such as waving of hands, is detected as an infrared radiation source and differentiated from an infrared radiation from other less moving objects, and that a change in infrared radiation entering a device is converted into an electric signal to judge whether it is caused by movement of an infrared radiation source.

A single pyroelectric element can reacts even to a change in background radiation, such as vibration, an environmental temperature change, and turning on and off of lights, thereby inevitably causing a malfunction. For this reason, it has been proposed to constitute a dual pyroelectric sensor wherein a pair of pyroelectric elements having mutually opposite polarities are connected in series or in parallel with each other to solve the problem of the malfunction, as disclosed in U.S. Pat. No. 3,839,640. In the dual sensor proposed by the above U.S. Patent when connected with an appropriately selected optical system, the above-mentioned noise, such as vibration or change in background radiation, causing a malfunction equally acts on (i.e., is a common-mode noise to) the pair of pyroelectric elements connected in anti-series or anti-parallel, and therefore provides equal and opposite signals which are canceled by each other, but a movement of an object to be detected can be detected by the pair of pyroelectric elements alternately and differentially to provide an electric signal.

The above proposal of the U.S. Patent has been further developed, e.g., by Japanese Laid-Open Patent Application (JP-A) 61-175583, Japanese Laid-Open Utility Model Application (JP-U) 58-32337 and European Laid-Open Patent Application (EP-A) 0131996 to provide practical dual pyroelectric sensors, which have been all proposed to obviate a difficulty in directly connecting lead wires to thin film electrodes (wire bonding) encountered in the dual sensor of the above U.S. Pat. No. 3,839,640 and more specifically propose to provide takeout electrodes which are integrally extended out of principal electrodes onto a pyroelectric sheet so as to provide leading ends reaching peripheries of the pyroelectric sheet.

It is true that the leading ends of the takeout electrodes of the dual pyroelectric sensors disclosed in the above three patent publications of JP-A 61-175583, JP-U 58-32337 and EP-A 0131996 can be electrically connected to lead wires, e.g., with an electroconductive adhesive at the peripheries of the pyroelectric sheets, thus alleviating the difficulty in lead wire connection.

However, the pyroelectric sensors proposed in the above three publications have posed a new problem unexpectedly caused by the takeout electrodes used for alleviating the difficulty in lead wire connection. That is, a pair of pyroelectric elements (pairing elements) are liable to have different effective light-receiving areas each defined as an area of overlapping of opposing electrodes inclusive of such takeout electrodes formed on both surfaces of the pyroelectric sheet when such opposing electrode patterns are formed on both surfaces with a positional deviation therebetween. If the pairing elements have different effective light-receiving areas, the above-mentioned common-mode noises appearing in the pairing elements are not completely canceled with each other to provide a dual pyroelectric sensor inferior in noise-canceling characteristic. For this reason, a pyroelectric infrared sensor prepared in the above-described manner has not always provided an expectedly high common-mode noise-canceling performance or the performance is fluctuated among the production lots thereof.

The above-mentioned JP-U 1-152226 has shown a solution to the difference in effective light-receiving area between the pairing elements caused by a position deviation in formation of opposing electrodes. Thus, in the pyroelectric sensor of JP-U 1-152226, the takeout electrodes are taken out in identical directions from the electrodes of the pairing elements so as to ensure the desired equality of effective light-receiving areas between the pairing elements. In the dual pyroelectric sensor, however, the takeout electrodes formed to constitute a pair of pyroelectric elements connected in an anti-parallel fashion are naturally elongated so as to run along the peripheral side of the pyroelectric sheet, whereby the pyroelectric sheet is required to have an enlarged area and the elongated takeout electrodes are liable to be broken.

On the other hand, the above-mentioned EP-A 0131996 has proposed a dual pyroelectric sensor in which two electrodes (first and third electrodes) are formed on a first major surface of a pyroelectric sheet in a larger area than the other two electrodes (second and fourth electrodes constituting pairing pyroelectric elements together with the first and third electrodes, respectively) formed on a second (i.e., opposite) major surface of the pyroelectric sheet. Such a dual sensor may be somewhat effective to obviate a difference in effective light-receiving area between the pairing elements even in case of a positional deviation between opposing electrodes. In this case, however, the positional deviation between opposing electrodes still causes a difference in effective light-receiving area between the pairing elements due to a difference in area of overlapping of takeout electrodes with opposing electrodes when such a positional deviation between opposing electrodes is caused.

SUMMARY OF THE INVENTION

A principal object of the present invention is to provide a dual pyroelectric sensor capable of ensuring an equality of effective-light receiving area between a pair of pyroelectric elements even in case of a positional deviation between opposing electrodes formed on both sides of a pyroelectric sheet, more specifically with a better performance in this respect than that accomplished by EP-A 0131996 and with a simple electrode structure unlike that in JP-U 1-152226 requiring elongated takeout electrodes but with only short takeout electrodes as in EP-A 0131996.

As a result of further study for accomplishing the above object, I have found it effective to adopt a unique structure of pairing pyroelectric elements wherein one of the pairing pyroelectric elements is constituted as a combination of a larger principal electrode on a first surface and a smaller principal electrode on an opposite second surface, respectively of a pyroelectric sheet, and the other of the pairing pyroelectric elements is constituted as a combination of a smaller principal electrode formed on the first surface and a larger principal electrode on the second surface, respectively of the pyroelectric sheet unlike the pairing pyroelectric elements in EP-A 0131996 comprising the combination of two larger principal electrodes on a first surface and two opposing smaller principal electrodes on a second surface, respectively of a pyroelectric sheet, thereby arriving at the present invention.

More specifically, according to the present invention, there is provided a dual pyroelectric sensor, comprising: a pyroelectric sheet, a pair of first and second electrodes formed on a first major surface of the pyroelectric sheet, and a pair of third and fourth electrodes disposed on a second major surface of the pyroelectric sheet opposite to the first and second electrodes, respectively; each of said first to fourth electrodes comprising a principal electrode region for providing an effective light-receiving area and a takeout electrode region integrally extended out of the principal electrode region so as to allow a connection with another electrical member, said first and third electrodes and a part of the pyroelectric sheet disposed between these electrodes constituting a first pyroelectric element, said second and fourth electrodes and a part of the pyroelectric sheet disposed between these electrodes constituting a second pyroelectric element; wherein the principal electrode region of said first electrode includes an enlarged region surrounding a region thereof overlying the principal electrode region of the third electrode opposite thereto; the principal electrode region of said fourth electrodes includes an enlarged region surrounding a region thereof overlying with the principal electrode region of the second electrode opposite thereto; and the takeout electrode regions of the second and third electrodes are initially taken out of the respective principal electrode regions thereof in mutually opposite directions, whereby the first and second pyroelectric elements are ensured to have substantially identical effective light-receiving areas even in case of a positional deviation between the first and second electrodes formed on the first major surface and the third and fourth electrodes formed on the second major surface.

In the dual pyroelectric sensor of the present invention, it is preferred that the takeout electrodes of the second and third electrodes are initially taken out in planar directions toward the second and first pyroelectric elements, respectively.

It is also preferred that the principal electrode regions of the second and third electrodes have substantially the same area, and the takeout electrode portions of the second and third electrodes have substantially the same width.

As described above, the dual pyroelectric sensor of the present invention is constituted by a first pyroelectric element having a larger principal electrode region on a first major surface and a smaller principal electrode region on a second major surface respectively of a pyroelectric sheet, and a second pyroelectric element having a smaller principal electrode region on the first major surface and a larger principal electrode region on the second major surface respectively of the pyroelectric sheet. Because of such a crossover size relationship among the four principal electrode regions, when the takeout electrodes of the four electrodes are taken out for example toward a spacing between the first and second pyroelectric elements, the two pyroelectric elements are free from a significant difference in effective light-receiving area even if such electrode patterns on both surfaces of the pyroelectric sheet are formed with some positional deviation or registration failure. Further, the takeout electrodes can be formed without substantial elongation and in a form allowing a so-called anti-parallel or anti-series connection with an associated electrical circuit, such as an amplifying circuit.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
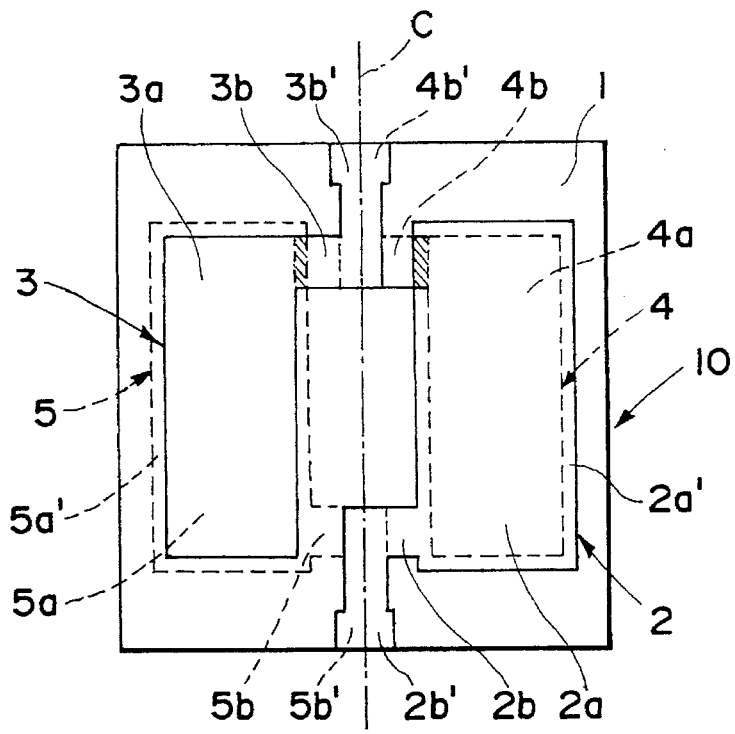
FIG. 1 is a plan view of an embodiment (anti-parallel connection) of the dual pyroelectric sensor according to the present invention.
Figure 2:
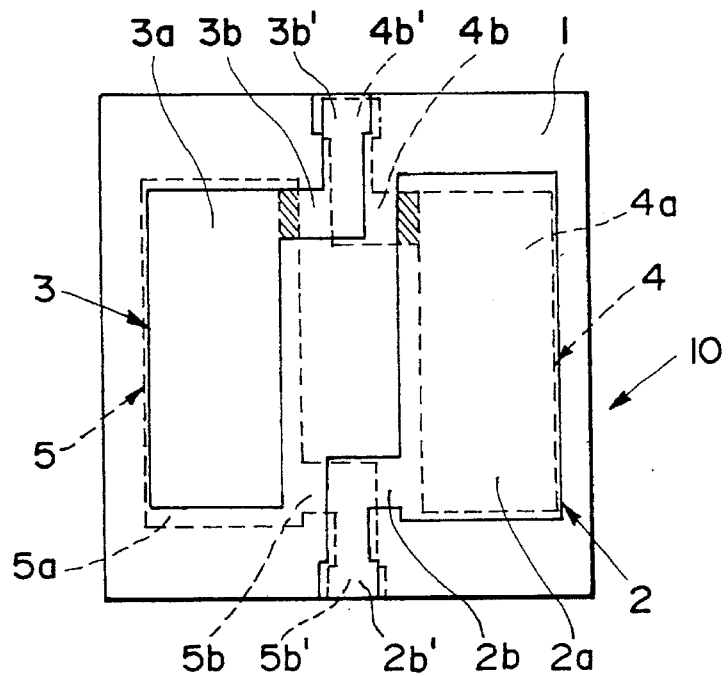
FIG. 2 is a plan view illustrating a positional deviation between opposing electrodes formed on both surfaces of a pyroelectric sheet in the pyroelectric sensor shown in FIG. 1.
Figure 3:
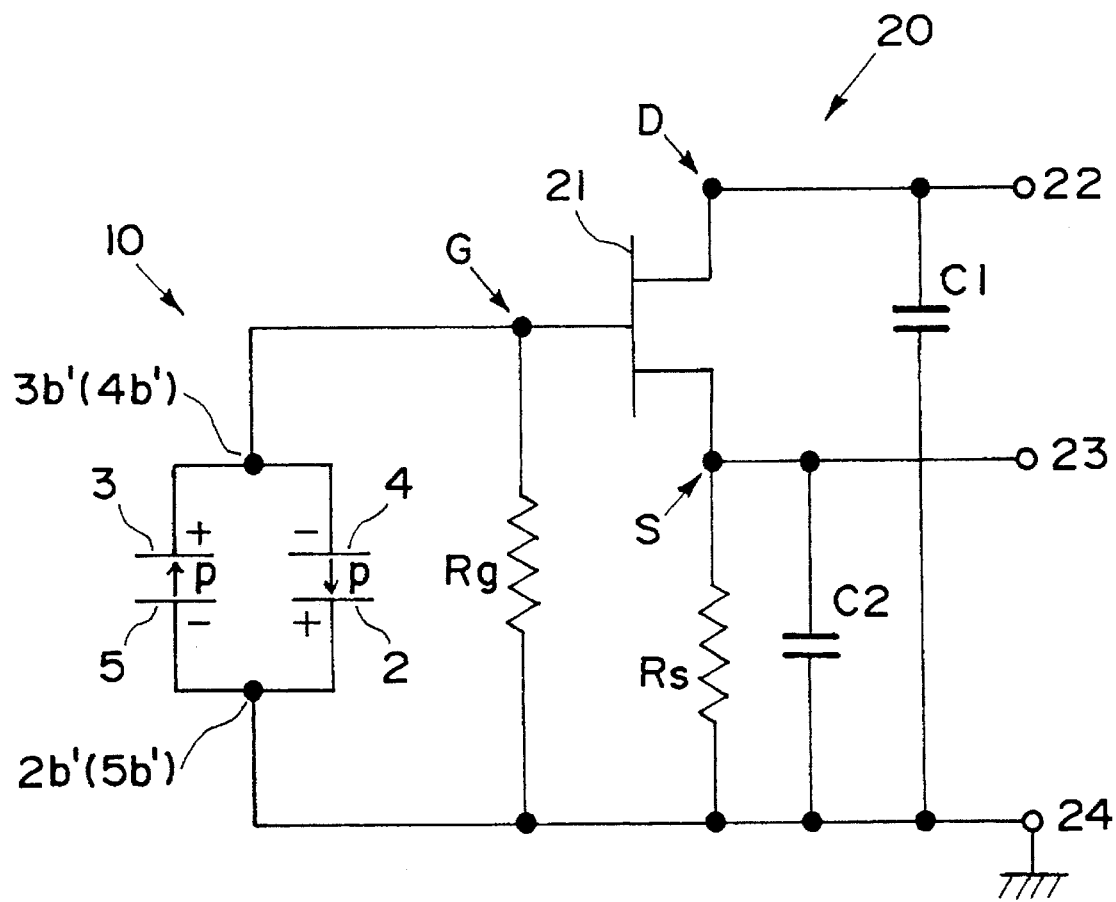
FIG. 3 is a circuit diagram showing an electrical circuit including the dual pyroelectric sensor shown in FIG. 1.

FIG. 1 is a plan view of an embodiment (anti-parallel connection) of the dual pyroelectric sensor according to the present invention. FIG. 2 is a top plan view illustrating a positional deviation between opposing electrodes formed on both surfaces of a pyroelectric sheet in the pyroelectric sensor shown in FIG. 1 wherein an electrode pattern represented by a broken line formed on a lower major surface of the pyroelectric sheet formed with a positional deviation (from the right position shown in FIG. 1) in a lower right direction relative to an electrode pattern represented by a solid line formed on an upper major surface of the pyroelectric sheet. FIG. 3 is a circuit diagram showing an electrical circuit including the dual pyroelectric sensor shown in FIG. 1 and an associated electrical circuit for post-treating electric signal from the pyroelectric sensor.

Referring to FIGS. 1 to 3, a dual pyroelectric sensor 10 includes a pyroelectric sheet (i.e., a pyroelectric material in the form of a sheet) 1, a pair of a first electrode 2 and a second electrode 3 (represented by a solid line) formed on an upper major surface of the pyroelectric sheet 1, and a pair of a third electrode 4 and a fourth electrode 5 (represented by a broken line) formed on a lower major surface of the pyroelectric sheet 1. The first to fourth electrodes 2–5 have principal electrode regions 2a–5a, respectively, for providing an effective light-receiving area, and also takeout electrodes 2b–5b, respectively, extended integrally from the principal electrode regions 2a–5a on the pyroelectric sheet 1, so that a first pyroelectric element is constituted by the first electrode 2, the third electrode 4 and a portion of the pyroelectric sheet 1 sandwiched between these electrodes, and a second pyroelectric element is constituted by the second electrode 3, the fourth electrode 5 and a portion of the pyroelectric sheet 1 sandwiched between these electrodes. The pyroelectric sheet 1 is uniformly poled in a direction of, e.g., from the lower surface to the upper surface and has an electrical property (pyroelectricity) causing a spontaneous polarization in response to a thermal change.

The takeout electrodes 2b–5b are respectively taken out from the respective principal electrode regions 2a–5a initially toward a spacing between the principal electrode regions and then bent in an L-shape so as to facilitate and ensure a lead wire connection with a post-stage electrical circuit, e.g., an impedance transformation circuit 20 shown in FIG. 3, and leading ends 2b'–5b' of the takeout electrode regions 2b–5b are formed in a larger width than the other portions and reach peripheral parts of the pyroelectric sheet 1. The dual pyroelectric sensor 10 may for example be easily connected to such a post-stage electrical circuit by fixing the dual pyroelectric sensor 10 onto a fixing substrate (not shown) of, e.g., alumina or plastic, by bonding; then fixing lead wires (not shown) from the post-stage electrical circuit onto the same fixing substrate so as to dispose tips thereof close to the leading ends 2b' and 5a' and the leading ends 3b' and 4b', respectively, of the takeout electrode regions; and finally bonding the lead wires and with the leading ends with an electroconductive bonding agent, such as a low-melting point solder or an electroconductive adhesive.

In this embodiment, the leading end 2b' of the takeout electrode of the first electrode 2 and the leading end 5b' of the takeout electrode of the fourth electrode 5 are disposed substantially opposite to each other with the pyroelectric sheet 1 therebetween at a peripheral part of the pyroelectric sheet 1, and the leading end 3b' of the takeout electrode of the second electrode 3 and the leading end 4b' of the takeout electrode of the third electrode 4 are disposed substantially opposite to each other with the pyroelectric sheet 1 therebetween at another peripheral part of the pyroelectric sheet 1, so as to facilitate a so-called anti-parallel connection as represented by an equivalent circuit 10 shown in FIG. 3, wherein the resultant first pyroelectric element and second pyroelectric element are connected in parallel with each other and with their poled directions functionally opposite to each other.

The principal electrode region 2a of the first electrode includes an enlarged region 2a' surrounding a region thereof overlapping with the principal electrode region 4a of the third electrode disposed opposite to the first electrode with respect to the pyroelectric sheet 1 therebetween, and the principal electrode region 5a of the fourth electrode similarly includes an enlarged region 5a' surrounding a region thereof overlapping with the principal electrode region 3a of the second electrode disposed opposite to the fourth electrode. Further, the takeout electrode regions 3b and 4b of the second and third electrodes formed in a relatively small width are initially taken out in substantially mutually opposite directions (hereinafter, sometimes referred to as "takeout direction(s)"). The principal electrode regions 3a and 4a have substantially the same area, and may be generally formed in the shape of a rectangle but can be formed in another shape.

Herein, the term "mutually opposite directions" means directions symmetrical with each other with respect to a center line (line C in FIG. 1) running in a spacing between the first and second pyroelectric elements so as to divide the spacing equal halves as they are (as in the embodiment of FIGS. 1 and 2) or after a parallel shift of either one of the takeout electrodes relative to the other along the center line (as in an embodiment of FIGS. 4 and 5 described hereinafter).

The takeout electrode regions 3b and 4b may preferably be taken out from either a left side or a right side of each of the principal electrode regions 3a and 4a. It is particularly preferred that the takeout electrode region 3b of the second electrode disposed on a left side is taken out from the principal electrode region 3a in a right direction and the takeout electrode region 4b of the third electrode disposed on a right side is taken out from the principal electrode region 4a in a left direction. In other words, it is preferred that the takeout electrode regions 3b and 4b are taken out in directions toward the second and first pyroelectric elements, respectively. According to the preferred embodiment, the takeout electrode regions 3b and 4b are disposed at the spacing between the first and second pyroelectric elements so that the takeout electrode regions can be formed in a small length. Incidentally, the takeout electrode regions need not necessarily be taken out perpendicularly but can be taken out obliquely from the principal electrode regions. Further, the takeout electrode regions need not have a constant width but can have an increasing or reducing width, respectively in the takeout directions. Each takeout electrode region can even be divided into plural portions. Accordingly, the takeout electrodes 3b and 4b may preferably have substantially the same width at their roots (i.e., at their initially taken-out positions) but can have different width as for as the effect of the present invention is accomplished, i.e., if the effective light-receiving areas of the two pyroelectric elements do not substantially differ from each other inclusive of the overlapping portions of the takeout electrode regions.

In the embodiment of FIG. 1, the takeout electrodes 2b and 5b of the first and fourth electrodes having a larger principal electrode region are also taken out initially in substantially mutually opposite directions and caused to be present at the spacing between the first and second pyroelectric elements. According to this preferred embodiment, the takeout electrode regions 2b and 5b can be formed in a short length and in a symmetrically neat pattern. It is however possible, to form the takeout electrode regions 2b and 5b so as to be taken out, e.g., downwardly from the lower sides of the principal electrode region 2a and 5a, respectively. In short, as the first and fourth electrodes are formed to have a larger principal electrode region, the takeout electrode regions therefrom can be taken out basically in any direction and from any part thereof without a substantial restriction.

Taking the case of a dual pyroelectric sensor for an intruder alarm, for example, each principal electrode region may generally have very small sizes including a width of ca. 1 mm and a length of ca. 2 mm, the electrode spacing (i.e., the spacing between two pyroelectric elements) may be set between 0.8 mm and 1.0 mm. In such a case, the line width of each takeout electrode region 2b–5b is naturally set to be smaller than the above-mentioned size and cannot but be made in such a small width also from the requirement of providing a compact device. Accordingly, a shorter length of takeout electrode region minimizes the risk of breakage of such a thin takeout electrode region, thus being advantageous.

The enlarged regions 2a' and 5a' may preferably be designed so that the smaller principal electrode regions 4a and 3a are not projected out of the larger principal electrode regions 2a and 5a, respectively, including the enlarged regions 2a' and 5a' even in case of a positional deviation in any arbitrary direction (longitudinally and/or laterally) during the electrode pattern formation. An example of such designing is to form an enlarged region in a constant width on the whole periphery of a smaller principal electrode region and setting the constant width to be larger than the accuracy of positional alignment of an electrode pattern-forming apparatus used.

The pyroelectric sheet 1 may basically comprise any material, examples of which may include a polymeric pyroelectric film as represented by poled vinylidene fluoride resin film and a thin sheet of a ceramic pyroelectric material, such as lead zirconate titanate. The present invention shows a particularly remarkable effect and is suitable when applied to a polymeric pyroelectric sheet having a small dielectric constant, a small heat capacity and a small conductivity. Herein, the vinylidene fluoride resin may include not only vinylidene fluoride homopolymer but also vinylidene fluoride copolymers comprising a major amount of vinylidene fluoride and a minor amount of another monomer copolymerizable therewith, such as vinyl fluoride, ethylene trifluoride, tetrafluoroethylene, trifluorochloroethylene, or hexafluoropropylene.

The electrodes 2 and 3 or the electrodes 4 and 5 formed on one side of the pyroelectric sheet 1 receiving (infrared) radiation incident thereto may preferably be radiation-transmissive or substantially transparent to the radiation. Examples of such radiation-transmissive electrode material may include translucent films (of, e.g., 3–20 nm in thickness) of gold, platinum, silver, nickel, chromium, aluminum and copper. On the other hand, the electrodes formed on the opposite side can comprise an ordinary opaque metal film or sheet. The transmissive and opaque electrodes may be formed on surfaces of a pyroelectric sheet, e.g., by a conventional method, such as evaporation or sputtering, and may be patterned by masking or conventional photolithographic technique.

An embodiment of a post-stage electrical circuit for processing signals from a dual pyroelectric sensor will now be described with reference to FIG. 3, which is a circuit diagram showing such an electrical circuit and an equivalent circuit of the dual pyroelectric sensor 10 shown in FIG. 1. Referring to FIG. 3, an impedance transformation circuit 20 as an example of such a post-stage electrical circuit includes a filed effect transistor (FET) 21 having a drain electrode D, a source electrode S and a gate electrode G. The dual pyroelectric sensor 10 has a so-called anti-parallel connection including a first pyroelectric element (shown on the right side) having electrodes 2 and 4 and a second pyroelectric element (shown on the left side) having electrodes 3 and 5 so that the first and second pyroelectric elements have functionally opposite poled direction P. The leading ends 3b' and 4b' of the takeout electrodes of the second and third electrodes are connected collectively to a lead wire leading to the gate electrode G, and the leading ends 2b' and 5b' of the takeout electrodes of the first and fourth electrodes are connected collectively to a lead wire leading to a grounding terminal 24. The circuit 20 also includes a power supply terminal 22 supplying a +B voltage to the drain electrode D, an output terminal 23 for taking out a detected voltage from the source electrode S, a gate resistor Rg, and a source resistor Rs.

The circuit 20 further includes by-pass capacitors C1 and C2 for intercepting a strong high-frequency current induced by UHF-frequency wireless communication waves, etc., and entering the impedance transformation circuit 20 through the power supply terminal 22 and the output terminal 23. In view of such a high-frequency induction current, the entire circuit shown in FIG. 3 may preferably be housed in a shield case.

Infrared radiation detection by the dual pyroelectric sensor 10 will now be described with reference to FIG. 3. The movement of a infrared radiation source, such as a human body, is alternately detected by the pair of pyroelectric elements in such a manner that the infrared radiation is first received by the first pyroelectric element including the electrodes 2 and 4 and then by the second pyroelectric element including the electrodes 3 and 5 in accordance with the movement of the radiation source. Then, corresponding to a difference in the received infrared radiation, the gate potential changes slightly to cause a change in drain current from the FET. The varying drain current passes through the source resistor Rs to provide a response voltage between the terminals 23 and 24.

On the other hand, with respect to the response of the dual pyroelectric sensor 10 to noises, such as vibration, variations in ambient temperature and background radiation, these noises are in phase and equally affect the pair of pyroelectric elements constituting the pyroelectric sensor and having spontaneous polarizations of anti-phases thus providing equal and opposite signals which cancel each other to result in no change in gate potential. Thus, the dual sensor 10 of FIG. 3 responds to only a differential stimulation (i.e., of non-common mode).

However, the above-mentioned common-mode noise-canceling effect is ensured only when the pyroelectric elements in pair have equal performances. A principally important factor determining the performance of a pyroelectric element is the effective light-receiving area thereof, i.e., the area of overlapping of opposing electrodes inclusive of the takeout electrode regions thereof formed on both surfaces of the pyroelectric sheet. If the effective light-receiving areas of the pairing pyroelectric elements are not equal to each other, the dual pyroelectric sensor can respond to a strong common-mode noise, thus causing a malfunction.

According to the dual pyroelectric sensor of the present invention, the equality of effective light-receiving area between the pairing elements is ensured even when the electrode patterns formed on both surfaces of the pyroelectric sheet are positionally deviated. This is explained with reference to FIGS. 1 and 2. The above-mentioned overlapping area of opposing electrodes of the first pyroelectric element (or the second pyroelectric element) is the sum of the area of the smaller principal electrode region 4a (or 3a) and the area of the hatched portion of the takeout electrode region 4b (or 3b) taken out from the principal electrode region respectively overlapping with the larger principal electrode region 2a (or 5a). In this embodiment, the principal electrode regions 4a and 3a are set to have substantially the same area, and the takeout electrode regions 4b and 3b are set to have substantially the same width at their root portions (i.e., at the hatched portions overlapping with the enlarged regions 2a' and 5a') between the pairing elements. Accordingly, in the state shown in FIG. 1 free from position deviation (i.e., with satisfactory registration) between the electrode patterns formed on both surfaces, even the areas of the hatched regions are equal to each other, so that the two pyroelectric elements are caused to have substantially the same effective light-receiving area.

In the state shown in FIG. 2 wherein the electrode pattern formed on the lower surface (represented by a broken line)

is positionally deviated in a lower right direction relative to the electrode pattern formed on the upper surface (represented by a solid line), the areal equality between the principal electrode regions 4a and 3a is retained and, compared with the state shown in FIG. 1, the hatched overlapping portions of the takeout electrodes are increased in length but the increase in length is caused to an equal extent for the two pyroelectric elements, so that the two pyroelectric elements still have substantially the same effective light-receiving area. In this embodiment, the length of a hatched region is increased when the electrode pattern on the lower surface is deviated rightwards and is decreased when the electrode pattern on the lower surface is deviated leftwards, but the change in length in any case is caused to an equal extent for the two pyroelectric elements, so that the equality of the effective light-receiving area between the pair of pyroelectric elements is ensured anyway.

Figure 6:
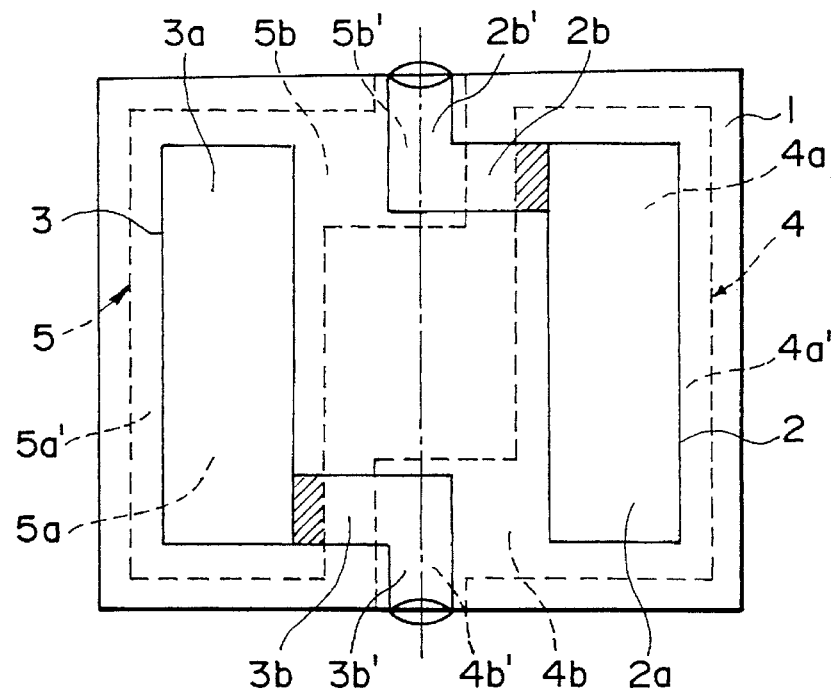
FIG. 6 is a plan view of a known dual pyroelectric sensor without using a crossover electrode size relationship adopted in the present invention.
Figure 7:
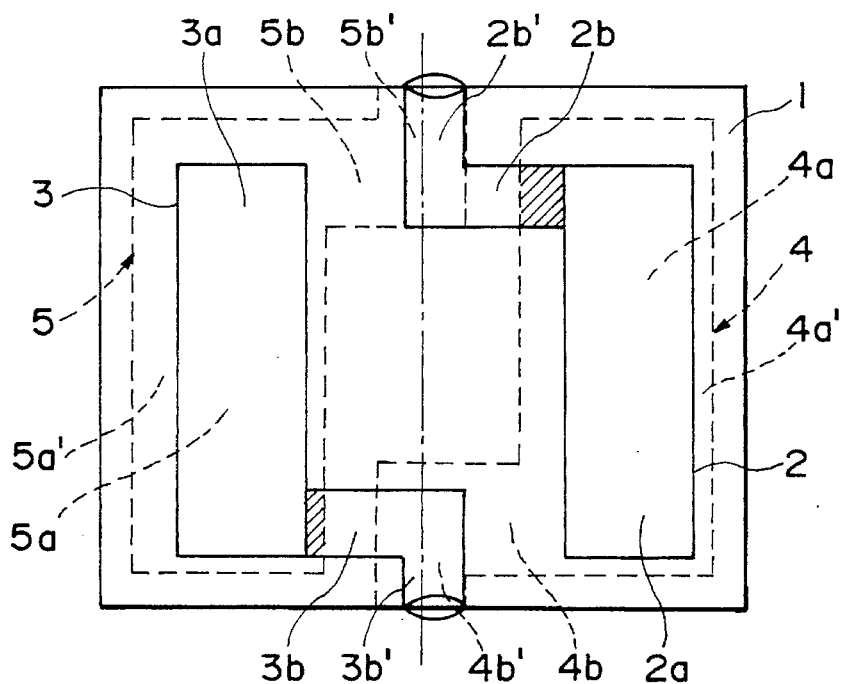
FIG. 7 is a plan view illustrating a positional deviation between opposing electrodes formed on both surfaces of a pyroelectric sheet in the pyroelectric sensor shown in FIG. 6.

On the other hand, FIG. 6 shows a top plan view of a dual pyroelectric sensor disclosed in EP-A 0131996 wherein like parts are denoted by like reference numerals as in FIG. 1. Unlike the embodiment shown in FIG. 1, principal electrode regions 2a and 3a formed on an upper surface of a pyroelectric sheet 1 are formed in a smaller size than principal electrode regions 4a and 5a, respectively formed on a lower surface of the pyroelectric sheet 1. In this case, however, when the electrode pattern formed on the upper surface (represented by a solid line) is deviated in a lower right direction relative to the electrode pattern formed on the lower surface (represented by a broken line) as shown in FIG. 7, the first pyroelectric element is caused to have a larger hatched region (i.e., an overlapping of a longer portion of takeout electrode region 2b with the larger principal electrode region 4a) in the first (right) pyroelectric element and a smaller hatched region (i.e., an overlapping of a smaller portion of takeout electrode region 3b with the larger principal electrode region 5a) in the second (left) pyroelectric element. As a result, the first and second pyroelectric elements are caused to have different effective light-receiving areas.

Thus, the comparison between FIGS. 2 and 7 is believed to clearly show the advantageous effect of the crossover electrode size relationship of the present invention that one of pairing pyroelectric elements is designed to have a larger principal electrode region on a first surface and a smaller principal electrode region on a second surface, respectively of a pyroelectric sheet, and the other pairing pyroelectric element is designed to have a smaller principal electrode region on the first surface and a larger principal electrode region on the second surface, respectively of the pyroelectric sheet.

In the embodiment of FIGS. 1 and 2, there are overlappings of takeout electrode regions in the neighborhoods of the leading ends 2b' and 5b' and the leading ends 3b' and 4b', respectively. The light-receiving regions given by the overlappings are disposed in the regions where the electrodes on both surfaces of the pyroelectric sheet are short-circuited with each other, and output voltages occurring at such regions due to the spontaneous polarization of the pyroelectric sheet thereat are canceled with each other, thus resulting in no adverse effect.

Figure 4:
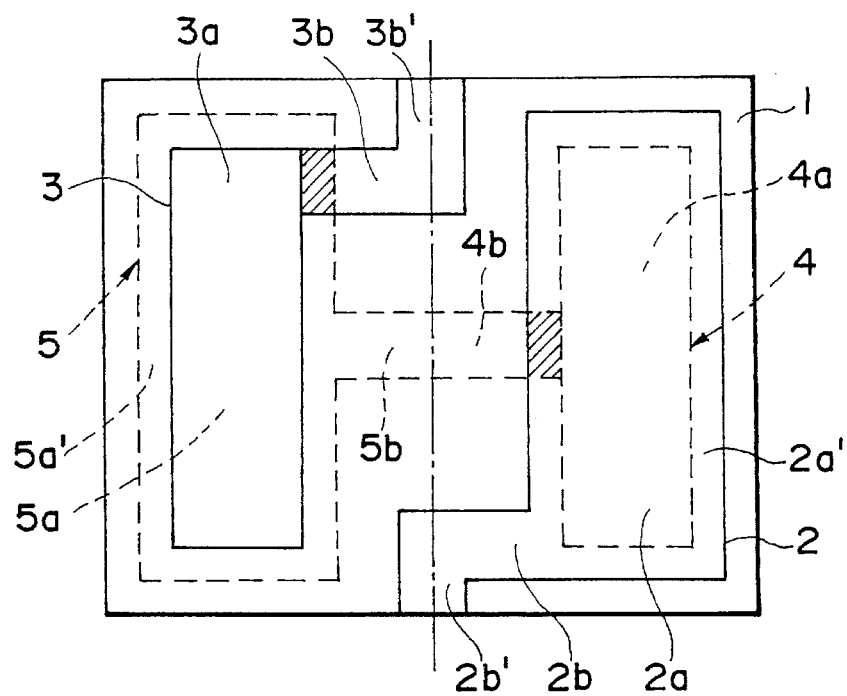
FIG. 4 is a plan view of another embodiment (anti-series connection) of the dual pyroelectric sensor according to the present invention.

FIG. 4 is a plan view of another embodiment (anti-series connection) of the dual pyroelectric sensor according to the present invention, wherein like parts are denoted by like reference numerals as in FIG. 1. Referring to FIG. 4, a dual pyroelectric sensor 10 of this embodiment also includes a first electrode 2 and a third electrode 4 on an upper surface of a pyroelectric sheet 1, and a second electrode 3 and a fourth electrode 5 on a lower surface of the pyroelectric sheet 1. A first pyroelectric element is constituted by the first electrode 2 and the third electrode 4 and a portion of the pyroelectric sheet 1 sandwiched between these electrodes. A second pyroelectric element is constituted by the second electrode 3, the fourth electrode 5 and a portion of the pyroelectric sheet 1 sandwiched between these electrodes. The first to fourth electrodes 2–5 have principal electrode regions 2a–5a, respectively, and takeout electrode regions 2b–5b integrally derived from the principal electrode regions 2a–5a, respectively. The second electrode 3 formed on the upper surface and the third electrode 4 formed on the lower surface, respectively of the pyroelectric sheet 1 have relatively small principal electrode regions 3a and 4a, respectively, of substantially the same area. The first electrode 2 formed on the upper surface and the fourth electrode 5 formed on the lower surface have larger principal electrode regions 2a and 5a, respectively, of substantially the same area, including enlarged regions 2a' and 5a', respectively, surrounding regions thereof opposite to the principal electrode regions 4a and 3a of the opposing third electrode 4 and second electrode 2, respectively.

In this embodiment of FIG. 4, unlike the embodiment of FIG. 1, the takeout electrode 4b of the third electrode 4 and the takeout electrode 5b of the fourth electrode 5 respectively formed on the lower surface of the pyroelectric sheet 1 are short-circuited with each other, and the takeout electrodes 2b and 3b of the first and second electrodes 2 and 3, respectively, formed on the upper surface of the pyroelectric sheet 1 have leading ends 2b' and 3b' reaching different peripheral parts of the pyroelectric sheet 1 for connection with a post-stage electrical circuit. As a result, the first and second pyroelectric elements are connected in series and with their poled directions functionally opposite to each other, thus making a so-called anti-series connection effective for common-mode noise cancellation similarly as the anti-parallel connection adopted in the embodiment of FIG. 1.

Figure 5:
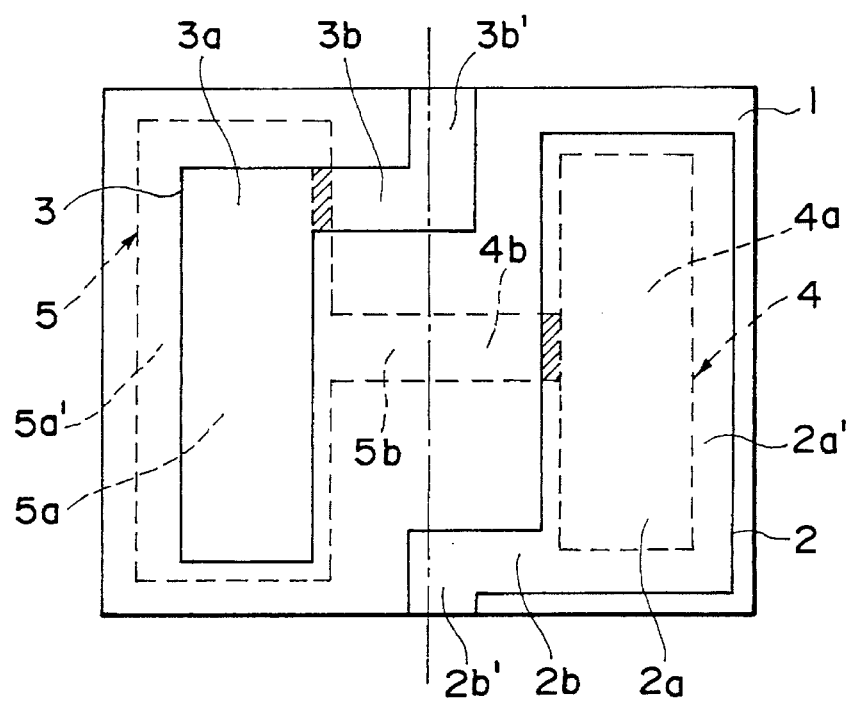
FIG. 5 is a plan view illustrating a positional deviation between opposing electrodes formed on both surfaces of a pyroelectric sheet in the pyroelectric sensor shown in FIG. 4.

Also in this case, when the electrode pattern (represented by a solid line) formed on the upper surface of the pyroelectric sheet 1 is positionally deviated, e.g., in a lower-right direction as shown in FIG. 5, relative to the electrode pattern (represented by a broken line) formed on the lower surface of the pyroelectric sheet 1, the area of a hatched region representing an overlapping region between a takeout electrode and an opposite larger principal electrode region is changed (decreased in this embodiment) relative to the state shown in FIG. 4 free from positional deviation, but the decrease in hatched area is caused to an equal extent for the first and second pyroelectric elements, so that the equality of effective light-receiving area inclusive of that given by an overlapping of a takeout electrode region is ensured between the first and second pyroelectric elements.

The equality of effective light-receiving area is also ensured even when the electrode pattern formed on the upper surface is deviated leftwards relative to the electrode pattern formed on the lower surface of the pyroelectric sheet so as to enlarge the hatched regions compared with the state shown in FIG. 4.

Incidentally, it is of course possible to modify the embodiment of FIG. 4 so that the takeout electrodes 2b and 3b formed on an upper surface of the pyroelectric sheet 1 are short-circuited with each other, and the takeout electrodes 4b and 5b formed on a lower surface of the pyroelectric sheet are caused to have leading ends reaching different peripheral parts of the pyroelectric sheet 1 for connection with a post-stage electrical circuit.

Some embodiments of the dual pyroelectric sensor according to the present invention have been described above. However, the dual pyroelectric sensor according to the present invention is not restricted to one including only one pair of pyroelectric elements disposed to have a characteristic arrangement as described above but may include plural pairs of pyroelectric elements disposed with a spacing therebetween to form an array of dual-type sensors while satisfying the characteristic arrangement in each pair of pyroelectric elements.

As described above, according to the present invention, there is provided a dual pyroelectric sensor including a pair of pyroelectric elements ensuring the substantial equality of effective light-receiving area between the pair of elements even when the electrode patterns formed on both surfaces of the pyroelectric sheet are positionally deviated from each other to some extent. As a result, the dual pyroelectric sensor is provided with an excellent performance for canceling common-mode noises, such as vibration, variation in temperature and background radiation.

What is claimed is:

1. A dual pyroelectric sensor, comprising: a pyroelectric sheet, a pair of first and second electrodes formed on a first major surface of the pyroelectric sheet, and a pair of third and fourth electrodes disposed on a second major surface of the pyroelectric sheet opposite to the first and second electrodes, respectively; each of said first to fourth electrodes comprising a principal electrode region for providing an effective light-receiving area and a takeout electrode region integrally extended out of the principal electrode region so as to allow a connection with another electrical member, said first and third electrodes and a part of the pyroelectric sheet disposed between these electrodes constituting a first pyroelectric element, said second and fourth electrodes and a part of the pyroelectric sheet disposed between these electrodes constituting a second pyroelectric element; wherein the principal electrode region of said first electrode includes an enlarged region surrounding a region thereof overlying the principal electrode region of the third electrode opposite thereto; the principal electrode region of said fourth electrodes includes an enlarged region surrounding a region thereof overlying with the principal electrode region of the second electrode opposite thereto; and the takeout electrode regions of the second and third electrodes are initially taken out of the respective principal electrode regions thereof in mutually opposite directions, whereby the first and second pyroelectric elements are ensured to have substantially identical effective light-receiving areas even in case of a positional deviation between the first and second electrodes formed on the first major surface and the third and fourth electrodes formed on the second major surface.

2. A dual pyroelectric sensor according to claim 1, wherein the takeout electrode regions of the second and third electrodes are initially taken out in planar directions toward the second and first pyroelectric elements, respectively.

3. A dual pyroelectric sensor according to claim 1, wherein the principal electrode regions of the second and third electrodes have substantially the same area, and the takeout electrode regions of the second and third electrodes have substantially the same width.

4. A dual pyroelectric sensor according to claim 1, wherein said pyroelectric sheet constituting the first and second pyroelectric elements is poled in a single thicknesswise direction.

5. A dual pyroelectric sensor according to claim 4, wherein the takeout electrodes of the first and fourth electrodes have respective leading ends which are disposed oppositely and connected with each other at an identical peripheral part of the pyroelectric sheet, and the takeout electrodes of the second and third electrodes have respective leading ends which are disposed oppositely and connected with each other at another peripheral part of the pyroelectric sheet, whereby the first and second pyroelectric elements are connected in parallel with each other and with their poled directions functionally opposite to each other.

6. A dual pyroelectric sensor according to claim 4, wherein the takeout electrodes of the first and second electrodes have respective leading ends which are disposed for connection at different parts of the pyroelectric sheet, and the takeout electrodes of the third and fourth electrodes are short-circuited to each other, whereby the first and second pyroelectric elements are connected in series with each other and with their poled directions functionally opposite to each other.

7. A dual pyroelectric sensor according to claim 2, wherein said pyroelectric sheet constituting the first and second pyroelectric elements is poled in a single thicknesswise direction.

8. A dual pyroelectric sensor according to claim 3, wherein said pyroelectric sheet constituting the first and second pyroelectric elements is poled in a single thicknesswise direction.

9. A dual pyroelectric sensor according to claim 7, wherein the takeout electrodes of the first and fourth electrodes have respective leading ends which are disposed oppositely and connected with each other at an identical peripheral part of the pyroelectric sheet, and the takeout electrodes of the second and third elements have respective leading ends which are disposed oppositely and connected with each other at another peripheral part of the pyroelectric sheet, whereby the first and second pyroelectric elements are connected in parallel with each other and with their poled directions functionally opposite to each other.

10. A dual pyroelectric sensor according to claim 8, wherein the takeout electrodes of the first and fourth electrodes have respective leading ends which are disposed oppositely and connected with each other at an identical peripheral part of the pyroelectric sheet, and the takeout electrodes of the second and third elements have respective leading ends which are disposed oppositely and connected with each other at another peripheral part of the pyroelectric sheet, whereby the first and second pyroelectric elements are connected in parallel with each other and with their poled directions functionally opposite to each other.

11. A dual pyroelectric sensor according to claim 7, wherein the takeout electrodes of the first and second electrodes have respective leading ends which are disposed for connection at different parts of the pyroelectric sheet, and the takeout electrodes of the third and fourth electrodes are short-circuited to each other, whereby the first and second pyroelectric elements are connected in series with each other and with their poled directions functionally opposite to each other.

12. A dual pyroelectric sensor according to claim 8, wherein the takeout electrodes of the first and second electrodes have respective leading ends which are disposed for connection at different parts of the pyroelectric sheet, and the takeout electrodes of the third and fourth electrodes are short-circuited to each other, whereby the first and second pyroelectric elements are connected in series with each other and with their poled directions functionally opposite to each other.

* * * * *